(12) United States Patent
Yeh et al.

(10) Patent No.: US 11,854,848 B2
(45) Date of Patent: Dec. 26, 2023

(54) AIR PROCESSING SYSTEM FOR SEMICONDUCTOR CONTAINER

(71) Applicant: TAIWAN SEMICONDUCTOR MANUFACTURING COMPANY LTD., Hsinchu (TW)

(72) Inventors: You-Cheng Yeh, Taichung (TW); Mao-Chih Huang, Taichung (TW); Yen-Ching Huang, Tainan (TW); Yu Hsuan Chuang, Taichung (TW); Tai-Hsiang Lin, Taichung (TW); Jian-Shian Lin, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 179 days.

(21) Appl. No.: 17/184,144

(22) Filed: Feb. 24, 2021

(65) Prior Publication Data

US 2022/0139746 A1     May 5, 2022

Related U.S. Application Data

(60) Provisional application No. 63/109,145, filed on Nov. 3, 2020.

(51) Int. Cl.
*H01L 21/673*     (2006.01)
*B01D 53/26*     (2006.01)
(Continued)

(52) U.S. Cl.
CPC .... *H01L 21/67393* (2013.01); *B01D 46/0036* (2013.01); *B01D 46/4245* (2013.01);
(Continued)

(58) Field of Classification Search
CPC ......... H01L 21/67393; H01L 21/67389; H01L 21/67769; B01D 2273/30; B01D 46/0036;
(Continued)

(56) References Cited

U.S. PATENT DOCUMENTS 6,758,876 B2*   7/2004   Suzuki .............. H01L 21/67393
                                                    454/192
6,875,282 B2*   4/2005   Tanaka ............. H01L 21/67393
                                                  156/345.31
(Continued)

FOREIGN PATENT DOCUMENTS

KR        20070054316 A   *   5/2007              G05D 7/00

OTHER PUBLICATIONS

KR20070054316A_ENG (Espacenet machine translation of Hyun) (Year: 2007).*

*Primary Examiner* — Jonathan Miller
*Assistant Examiner* — Gabriel E Gitman
(74) *Attorney, Agent, or Firm* — WPAT LAW; Anthony King

(57) ABSTRACT

A container includes a container body and an air processing system. The container body includes a plurality of walls defining an interior space for receiving wafers. The air processing system is attached to the container body. The air processing system includes an exchange module, an air extraction module, a first contaminant removal module, a processing module, a second contaminant removal module, a controller module and a power module. The exchange module is coupled to one of the walls of the container body. The air extraction module extracts air from the container body. The first contaminant removal module is coupled to the air extraction module and the exchange module. The processing module is coupled to the air extraction module. The second contaminant removal module is coupled to the processing module and the exchange module. The controller
(Continued)

module is configured to turn the air extraction module on and off.

20 Claims, 7 Drawing Sheets

(51) Int. Cl.
  *B01D 46/00*    (2022.01)
  *B65D 85/30*    (2006.01)
  *B65D 81/20*    (2006.01)
  *B01D 53/28*    (2006.01)
  *B01D 46/44*    (2006.01)
  *B01D 46/42*    (2006.01)

(52) U.S. Cl.
  CPC ..... *B01D 46/4263* (2013.01); *B01D 46/4272* (2013.01); *B01D 46/448* (2013.01); *B01D 53/261* (2013.01); *B01D 53/28* (2013.01); *B65D 81/2007* (2013.01); *B65D 81/2069* (2013.01); *B65D 85/30* (2013.01); *B01D 2253/104* (2013.01); *B01D 2253/11* (2013.01); *B01D 2253/112* (2013.01); *B01D 2253/116* (2013.01); *B01D 2273/30* (2013.01)

(58) Field of Classification Search
  CPC ............ B01D 46/4245; B01D 46/4263; B01D 46/4272; B01D 46/448; B01D 53/261; B01D 53/28; B01D 53/0407; B01D 53/26; B01D 2253/104; B01D 2253/11; B01D 2253/112; B01D 2253/116; B01D 2258/0216; B65D 81/2007; B65D 81/2069; B65D 85/30
  See application file for complete search history.

(56) References Cited

U.S. PATENT DOCUMENTS

| | | | |
|---|---|---|---|
| 7,314,068 B2 * | 1/2008 | Nakano | H01L 21/67772 414/217 |
| 2005/0096776 A1 * | 5/2005 | Beaulieu | H01L 21/67253 700/115 |
| 2006/0156979 A1 * | 7/2006 | Thakur | C23C 16/45546 438/476 |
| 2016/0334145 A1 * | 11/2016 | Pahwa | F28F 13/185 |
| 2017/0004983 A1 * | 1/2017 | Madigan | H10K 71/811 |
| 2018/0171906 A1 * | 6/2018 | Ulrey | F02B 37/183 |

* cited by examiner

AIR PROCESSING SYSTEM FOR SEMICONDUCTOR CONTAINER

PRIORITY DATA

This patent claims the benefit of U.S. Provisional Patent Application Ser. No. 63/109,145 filed Nov. 3, 2020, the entire disclosure of which is hereby incorporated by reference.

BACKGROUND

Integrated circuits are typically manufactured in automated or semi-automated facilities, by proceeding substrates/wafers in and on which the devices are fabricated through a large number of manufacturing steps to complete the devices. The number and type of manufacturing steps a semiconductor device must undergo depends on the designs of the semiconductor device to be fabricated. For instance, a sophisticated chip may require several hundred manufacturing steps.

Modern semiconductor fabrication facilities ("fabs") employ systems to transport workpieces such as substrates/wafers and reticles to the tools required in the process flow. Therefore, reticle transporting devices and wafer transporting devices have been adopted in semiconductor manufacturing tools/apparatuses used in manufacturing processes. A system that is able to safely and efficiently transfer the workpieces in order to improve the throughput and output rate is thus necessary.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
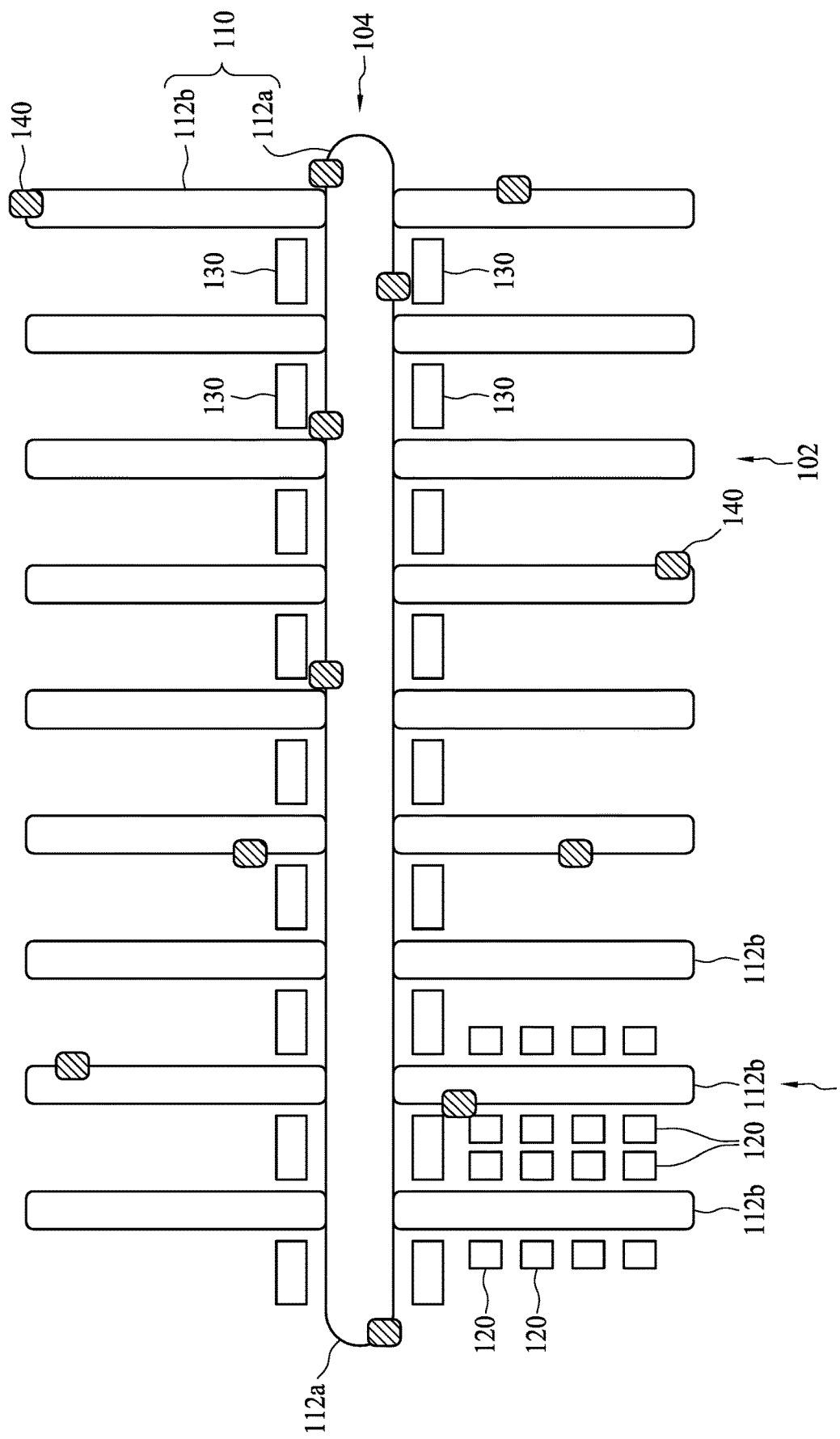
FIG. 1 is a schematic layout diagram of a system for a semiconductor fabrication facility, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat references numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any references to direction or orientation are merely intended for convenience of description and are not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by references to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially." "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the term "wafer" and the term "substrate" may be used interchangeably in the present disclosure.

Automated Material Handling Systems (AMHS) have been widely used in semiconductor fabrication facilities to automatically handle and transport groups or lots of wafers between various processing machines ("tools") used in chip manufacturing. The tools may include oxidation, diffusion, ion implantation, rapid thermal processing (RTP), chemical vapor deposition (CVD), physical vapor deposition (PVD), epitaxy, etch, and photolithography tools. A typical fab may include one or more floors having a plurality of process bays including processing tools and wafer staging equipment, which are interconnected by the AMHS.

After undergoing a processing step, a substrate/wafer is removed from a process chamber in which the processing step was performed, and the substrate/wafer is transferred to a carrier where it is temporarily stored until subsequent processing is performed. A semiconductor fab may include numerous types of automated and manual vehicles for moving and transporting wafer carriers throughout the fab during the manufacturing process. These vehicles may include, for example, automatic guided vehicles (AGVs), personal guided vehicles (PGVs), rail guided vehicles (RGVs), overhead shuttles (OHSs), and overhead hoist transports (OHTs). An OHT system automatically moves OHT "vehicles" that carry and transport wafer carriers, such as standard mechanical interface (SMIF) pods or front-opening unified pods (FOUPs) holding multiple wafers, from a processing or work tool or a stocker to a loadport of another tool or other apparatus in the fab. The OHT system may be used to transport vehicles within a bay (intra-bay transport) or between bays (inter-bay transport). The OHT system also moves empty vehicles (i.e., vehicles without a wafer carrier) to the tool loadport or other apparatus for receiving and removing empty or full SMIF pods or FOUPs that may contain wafers for further transport and/or processing by other tools.

During the transfer of the substrate/wafer to the carrier, the substrate/wafer may be exposed to the surrounding environment, including undesired particulates, such as moisture, oxygen and airborne molecular contamination (AMC). Such exposure often requires extra operation to remedy effects in the substrate caused by the undesired particulates.

The present disclosure therefore provides an air processing system that can be installed on a semiconductor container. The air processing system helps to maintain low humidity and clean conditions at a desired temperature inside the semiconductor container. Further, the air processing system can be moved together with the semiconductor container, and can therefore maintain such conditions inside the semiconductor container during the storage and transport.

FIG. 1 is a schematic layout diagram of a system 100 for a semiconductor fabrication facility in accordance with some embodiments of the present disclosure. The system 100 may be provided in a clean room of a semiconductor factory or the like. In some embodiments, the system 100 can be provided in the facility having one or more floors, but the disclosure is not limited thereto. Referring to FIG. 1, the system 100 may include a network of OHT rails 110, a plurality of wafer processing metrology tools 120, a plurality of wafer stockers 130, and a plurality of carriers 140 such as OHT vehicles 140.

Referring to FIG. 1, the system 100 is usually organized into a plurality of bays 102, each bay 102 including several of the wafer processing or metrology tools 120. In some embodiments, each bay 102 may include several tools 120 for performing various semiconductor manufacturing, testing, or metrology steps. Thus, the network of OHT rails 110 can include two types of transport loops: an inter-bay loop 112a between the multiples bays 102, and an intra-bay loop 112b between the processing tools 120 of a single bay 102. In some embodiments, it is also possible that these two types of transport loops can be merged into one monolithic system with appropriate control and transfer mechanisms. In some embodiments, the inter-bay loop 112a can be arranged over a central corridor or a central aisle 104, and the plurality of bays 102 (each including several of the processing tools 120) are arranged on opposing lateral sides of the central aisle 104, as shown in FIG. 1, but the disclosure is not limited thereto. Thus, the intra-bay loops 112b are also arranged on the opposing lateral sides of the central aisle 104, as shown in FIG. 1. In some embodiments, the OHT rails 110 are monorails that are affixed to and suspended from the ceiling of the clean room.

Each bay 102 may include a wafer stocker 130, and each wafer stocker 130 includes multiple bins for temporarily holding and staging a plurality of wafer containers during the fabrication process. In some embodiments, wafers are stored in a semiconductor container such as the SMIF pods or FOUPs, and the semiconductor container may be transported by the carriers 140. The wafer containers may include SMIF pods which may hold a plurality of 200 mm (8 inch) wafers, or FOUPs which may hold larger 300 mm (12 inch) wafers. In some embodiments, the wafer stockers 130 include a single mast robotic lift or crane having a weight-bearing capacity sufficient for lifting, inserting, and retrieving wafer containers one at a time from the bins. The wafer stocker 130 holds multiple SMIF pods or FOUPs in preparation for transporting a SMIF pod or FOUP to the loadport of a processing tool.

In some embodiments, after a processing step is performed in the tool 120, the wafers are removed from the tool 120 and placed in the semiconductor container for transport or storage until subsequent processing. For example, in a middle-end-of-line (MEOL) or a back-end-of-line (BEOL) metallization processing step, a dielectric layer may be etched using an etching tool to form an opening for accommodating conductive features. After the etching step, the substrate may be removed from the etching tool, stored in the semiconductor container, and transported to a subsequent processing tool, such as a tool for forming the conductive features in the opening, by the carrier 140. It is known there are tight constraints on the duration of the etching and the forming of the conductive feature due to oxidation risk, which may cause low wafer yield. Therefore, humidity control is important not only during the processing, but also during the transport and storage.

In some embodiments, foundry may use a dry air purge system to clean an internal space of the semiconductor container before moving the wafers into the semiconductor container. However, as the wafers are moved into the semiconductor container, a condition of the internal space may be changed because residues or by-products that are generated by a previous processing step may be brought into the semiconductor container together with the wafers. Further, the wafers may be exposed to the surrounding environment, including contaminants such as moisture and oxygen, and moisture and oxygen maybe brought into the semiconductor container.

Figure 2:
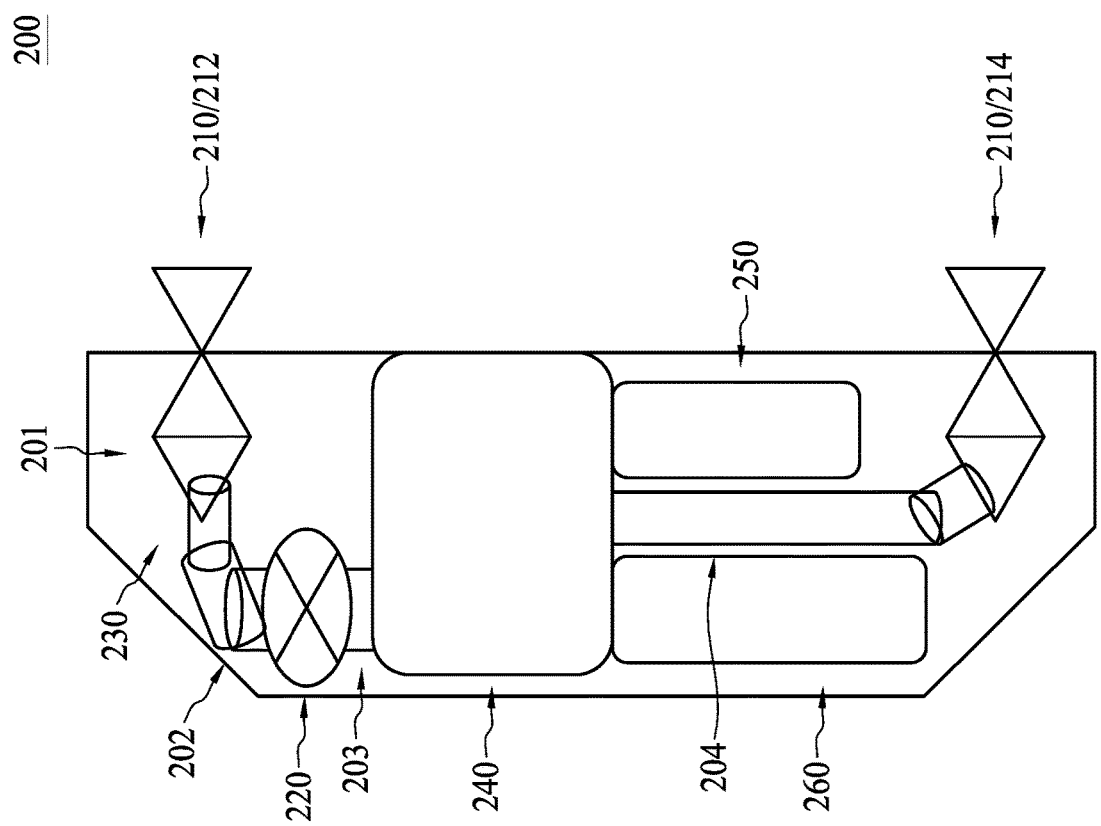
FIG. 2 is a schematic drawing illustrating an air processing system according to one or more embodiments.
Figure 3:
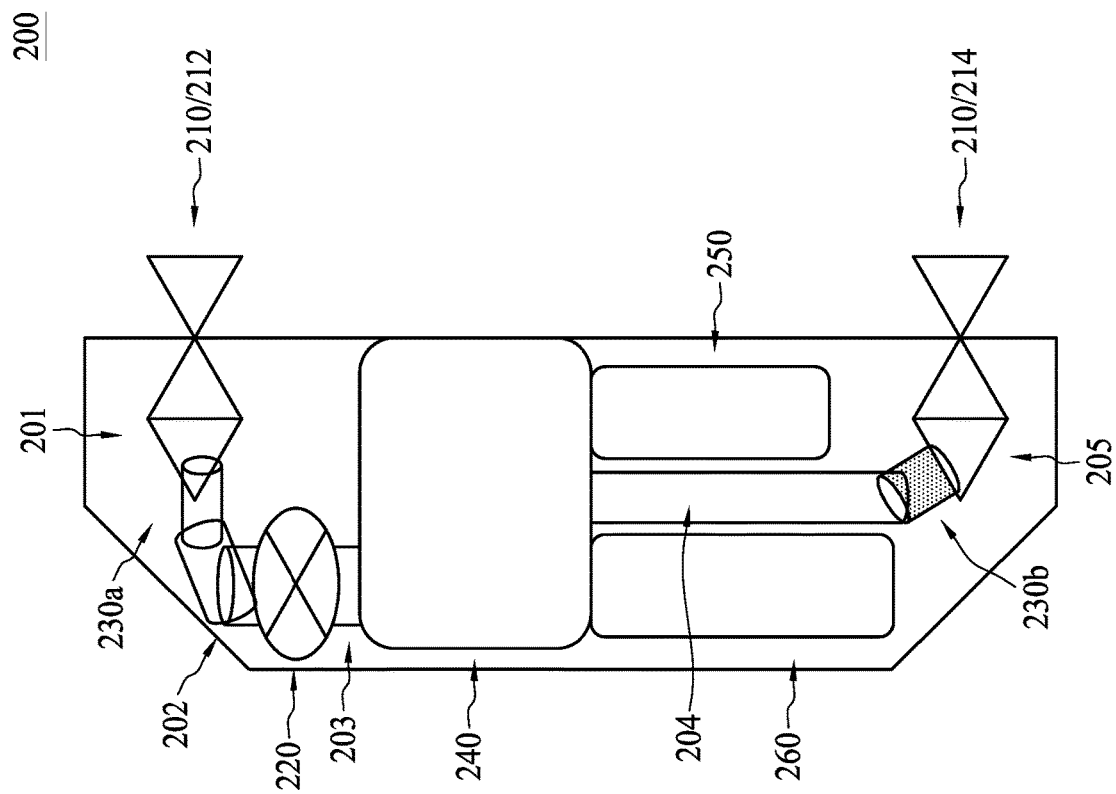
FIG. 3 is a schematic drawing illustrating an air processing system according to one or more embodiments.

Referring to FIG. 2, in some embodiments, an air processing system 200 is provided. In some embodiments, the air processing system 200 can be attached to or installed on a semiconductor container. In some embodiments, the air processing system 200 may include a plurality of modules: an exchange module 210, an air extraction module 220, a contaminant removal module 230, a processing module 240, a controller module 250 and a power module 260. Referring to FIG. 3, in some embodiments, the air processing system 200 may include an exchange module 210, an air extraction module 220, a first contaminant removal module 230a, a second contaminant removal module 230b, a processing module 240, a controller module 250 and a power module 260.

In some embodiments, the exchange module 210 includes an inlet valve 212 and an outlet valve 214. The inlet valve 212 and the outlet valve 214 may be coupled to a container, such as a semiconductor container, but the disclosure is not limited thereto. In some embodiments, the air processing system 200 may be sealed off before being attached or installed on the container when the inlet valve 212 and the outlet valve 214 are closed. In some embodiments, after being attached or installed on the container, the air processing system 200 may be isolated from the container when the inlet valve 212 and the outlet valve 214 are closed. The air processing system 200 may be connected to the container when the inlet valve 212 and/or the outlet valve 214 are opened. In some embodiments, the inlet valve 212 and the outlet valve 214 are non-return valves, but the disclosure is not limited thereto. In some embodiments, the inlet valve 212 and the outlet valve 214 can be individually opened by a force generated by air flow. In some embodiments, the opening and the closing of the inlet valve 212 and the outlet valve 214 can be individually controlled by the controller module 250, which is described below.

In some embodiments, the air extraction module 220 is configured to extract air from the container (i.e., the semiconductor container). In some embodiments, when the inlet valve 212 and the outlet valve 214 are both opened, the air extraction module 220 can extract air from the container through the inlet valve 212, push air back into the container through the outlet valve 214, and thus cause air circulation. In some embodiments, the inlet valve 212 can be opened while the outlet valve 214 is closed, causing a vacuum condition or vacuum-like condition inside the container when the air extraction module 220 extracts air from the container. Further, the air extraction module 220 is able to control the air circulation. In some embodiments, the air circulation (or air flow) can be increased or reduced by adjusting the efficiency of the air extraction module 220. In some embodiments, the air extraction module 220 includes at least a pump including, for example but not limited thereto, a piezoelectric pump, a pneumatic pump, or an electrostatic pump.

In some embodiments, the contaminant removal module 230 or the first contaminant removal module 230a may be disposed between the inlet valve 212 and the air extraction module 220. Further, the contaminant removal module 230 or the first contaminant removal module 230a is coupled to both the inlet valve 212 and the air extraction module 220, as shown in FIGS. 2 and 3. In some embodiments, a tube 201 may be used to couple the inlet valve 212 to the contaminant removal module 230, and a tube 202 may be used to couple the contaminant removal module 230 to the air extraction module 220, but the disclosure is not limited thereto. In some embodiments, the contaminant removal module 230 (or the first contaminant removal module 230a) includes at least a particle filter, an AMC filter, or activated carbon. The filters help to reduce contamination in the air processing system 200 and thus improve the module service life of the air processing system 200.

The processing module 240 is coupled to the air extraction module 220. In some embodiments, a tube 203 may be used to couple the air extraction module 220 to the processing module 240, but the disclosure is not limited thereto. In some embodiments, the processing module 240 includes one or more filtering or adsorbing elements. For example, the processing module 240 may include an adsorbing element such as desiccant materials. The desiccant materials include, for example but not limited thereto, molecular sieve, silica gel, bentonite clay, calcium chloride ($CaCl_2$), magnesium chloride ($MgCl_2$), or activated aluminum oxide. In some embodiments, the desiccant material may include fiber desiccant. The processing module 240 provides the ability to reduce the moisture of the passing air to below approximately 0.7%, but the disclosure is not limited thereto. In some embodiments, the processing module 240 may include a filtering element such as a particle filter. In some embodiments, the processing module 240 may include activated carbon, AMC filter fabric, or nonwoven cloth. The particle filter helps to filter out particles. In some embodiments, when the processing module 240 include the particle filter, the air passes through at least the two filters (i.e., one in the air extraction module 220 and one in the processing module 240), therefore particle or residue removal can be improved. In some embodiments, the processing module 240 may include filtering element or adsorbing element such as chemical filter or chemical-adsorbing element. For example, the chemical filter or the chemical-adsorbing material can include fluoride-adsorbing material, chloride-adsorbing materials, organic chemical-adsorbing materials such as amine-adsorbing materials, or other suitable chemical-adsorbing materials. The chemical filter helps to filter out residues.

It should be noted that types and/or numbers of the filtering elements and/or adsorbing elements can be modified according to different processing requirements. For example, the processing module 240 may include one absorbing element such as the desiccant materials, the particle filter or the chemical-adsorbing materials. In some embodiments, the processing module 240 may include more than one adsorbing elements and/or filtering elements. For example, the processing module 240 may include the desiccant materials, the chemical-adsorbing element, the particle filter, and combinations thereof. In other words, the adsorbing element and/or the filter elements may be selected and adopted in the processing module 240 according to different processing requirements or air condition requirements.

In some embodiments, the processing module 240 is pluggable for maintenance. In some embodiments, the term "pluggable" refers to that the processing module 240 is capable of being plugged and adapted into the container and removed from the container without causing damage. In such embodiments, the processing module 240 may be removed from the air processing system 200 in a changing station. Further, the processing module 240 may be replaced with another processing module 240. The desiccant materials in the processing module 240 removed from the air processing system 200 may be renewed in the changing station. Further, contaminants may be removed from the processing module 240 and collected in the changing station. The processing module 240 with renewed desiccant may be ready for use again.

In some embodiments, the processing module 240 maybe coupled to the outlet valve 214 as shown in FIG. 2. In such embodiments, a tube 204 may be used to couple the processing module 240 to the outlet valve 214, but the disclosure is not limited thereto. In some embodiments, the processing module 240 may be coupled to the second contaminant removal module 230b, as shown in FIG. 3. In such embodiments, a tube 204 may be used to couple the processing module 240 to the second contaminant removal module 230b, but the disclosure is not limited thereto. Further, in such embodiments, the second contaminant removal module 230b may be coupled to the outlet valve 214. Similarly, a tube 205 may be used to couple the second contaminant removal module 230b to the outlet valve 214.

The second contaminant removal module 230b includes at least a particle filter, an AMC filter, or activated carbon. In some embodiments, because the air passes through at least the three filters (i.e., one in the first contaminant removal module 230a, one in the processing module 240, and one in the second contaminant removal module 230b), particle or residue removal can be further improved. Thus, container pollution or container contamination prevention can be further improved.

In some embodiments, the air processing system 200 includes a controller module 250. In some embodiments, the controller module 250 may include a controller such as, for example but not limited thereto, a microcontroller unit (MCU), a programmable logic controller (PLU), a field programmable gate array (FPGA) or a logic IC. In some embodiments, the controller module 250 (i.e., the controller) is configured to open and close the exchange module 210 (i.e., the inlet valve 212 and the outlet valve 214), and to turn the air extraction module 220 on and off. In some embodiments, the controller module 250 (i.e., the controller) may further adjust efficiency of the air extraction module 220 to control the air circulation or the air flow. In some embodiments, the controller module 250 may open and close the exchange module 210 and turn the air extraction module 220 on or off according to a time constraints (i.e., in a time mode). In some embodiments, the controller module 250 may adjust the power of the air extraction module 220 according to a time constraint. In other words, the controller module 250 may individually control the opening and closing of the exchange module 210, the turning on and the turning off of the air extraction module 220, and the efficiency of the air extraction module 220 according to different time requirements.

In some embodiments, the controller module 250 may individually control the opening and closing of the exchange module 210, the turning on and off of the air extraction module 220, and the efficiency of the air extraction module 220 according to an event constraint (i.e., in an event mode). In such embodiments, the controller module 250 may further include at least a humidity sensor. The humidity sensor may be installed in an interior sidewall of the container. The humidity sensor may send humidity data to the controller. When the humidity inside the container is greater than a desired humidity value, the controller may open the exchange module 210 and turn on the air extraction module 220 in order to reduce the humidity. For example, the humidity may be reduced to below approximately 0.7%, but the disclosure is not limited thereto. In some embodiments, when the humidity reaches the desired value, the controller module 250 may individually close the exchange module 210 and/or turn off the air extraction module 220, but the disclosure is not limited thereto.

In some embodiments, the air processing system 200 may further adjust an interior temperature of the container by providing air with a desired temperature. In such embodiments, the controller module 250 may include at least a temperature sensor. Further, the controller module 250 may further include a heating/cooling chip. The heating/cooling chip may be installed on the inlet valve 212, and/or on the outlet valve 214, depending on product requirements. The temperature sensor may be installed on the interior sidewall of the container. The temperature sensor may send temperature data to the controller. When the temperature in the container is greater than or less than a desired temperature, the controller may turn on the exchange module 210, the air extraction module 220 and the heating/cooling chip in order to adjust the air temperature and provide the air with the desired temperature into the container.

In some embodiments, the power module 260 provides power to the controller module 250 and the air extraction module 220. In some embodiments, the power module 260 may include a battery, which includes fire-proof and explosion-proof material. For example, the battery can be, for example but not limited thereto, a lithium (Li) battery, such as a self-terminated oligomer with hyper-branched architecture (STOBA) lithium battery. In some embodiments, the battery may include a plurality of cells, and the power module 260 may include a design that prevents short-circuits between cells.

In some embodiments, the power module 260 may be pluggable for charging. In such embodiments, the power module 260 may be replaced with a charged power module 260 in a changing station. The power module 260 removed from the air processing system 200 may be recharged in the changing station. In some embodiments, the charging can be wireless charging or wired charging.

Accordingly, the exchange module 210, the air extraction module 220, the contaminant removal module 230 (or the first and second contaminant removal modules 230a and 230b), the processing module 240 and the tubes 201 to 205 are connected to enable air circulation. However, the arrangement of the controller module 250 and the battery module 260 can be adjusted according to different product designs or space requirement.

In addition to the replacement of the processing module 240 and the power module 260 in the changing station, data loading and firmware updating operations can also be performed in the changing station, but the disclosure is not limited thereto.

Figure 4:
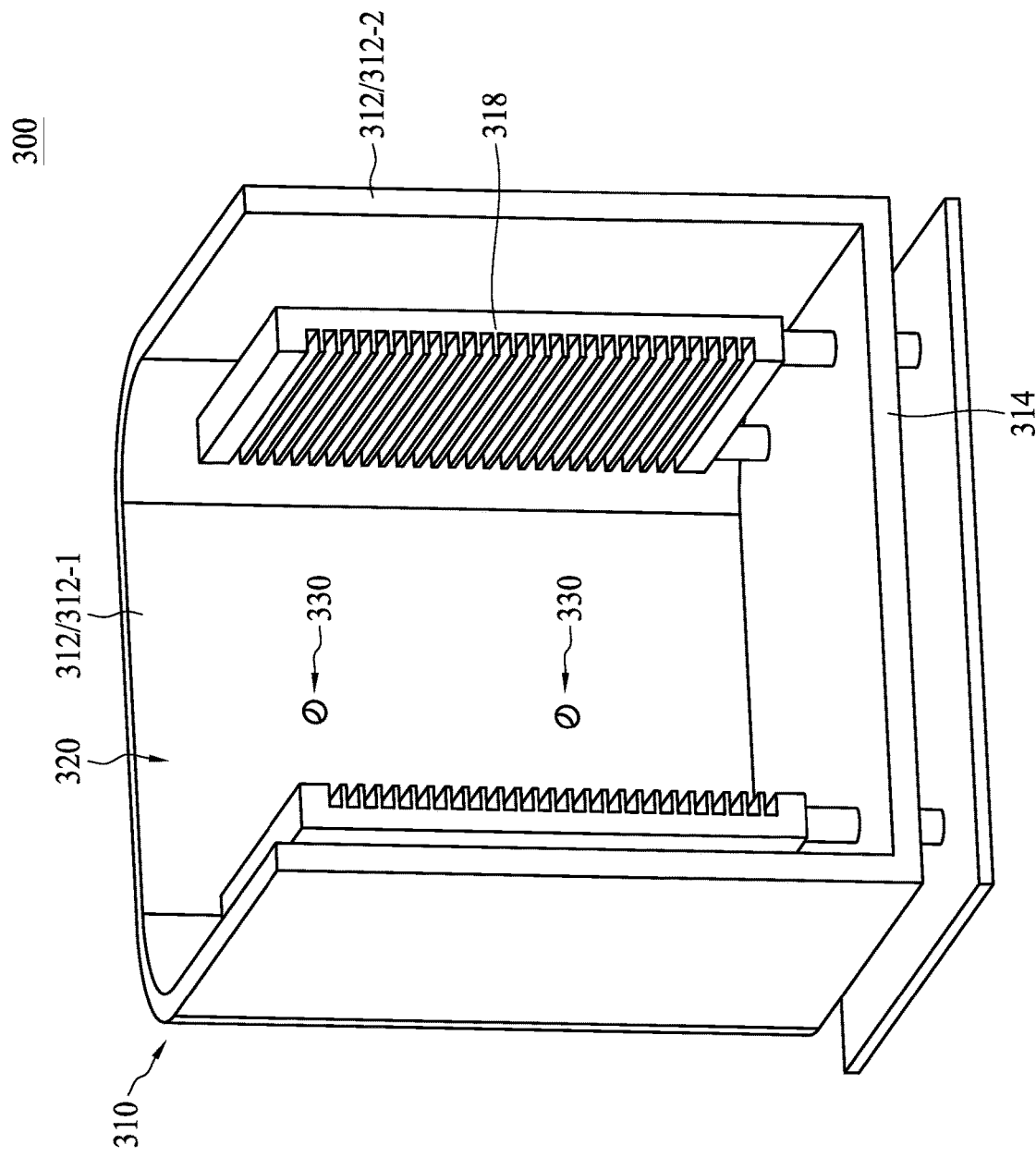
FIG. 4 is a schematic drawing illustrating an interior space of a semiconductor container according to one or more embodiments.

Please refer to FIG. 4, which is a schematic drawing illustrating a semiconductor container 300 including an air processing system. In some embodiments, the semiconductor container 300 may include the air processing system 200 shown in FIG. 2 or FIG. 3, but the disclosure is not limited thereto.

In some embodiments, the semiconductor container 300 may be a cassette, a FOUP, a SMIF, a reticle carrier, or any other suitable carrier for carrying one or more semiconductor substrates or wafers used in the semiconductor processing steps. In some embodiments, the semiconductor container 300 may include a container body 310, and the container body 310 includes a plurality of walls 312. In some embodiments, the walls 312 may include a backside wall 312-1 that is opposite to a front door and two side walls 312-2 coupling the backside wall 312-1 and the front door. Further, the walls 312, a bottom 314 and a top 316 (shown in FIG. 5) define an interior space 320 for receiving the wafers. The semiconductor container 300 can further include one or more substrate holders 318 disposed within the container body 310 to provide support to the substrates. The substrate holders 318 may be coupled to at least one of the walls 312. The substrate holder 318 may include plates, small extrusions on or grooves in the walls 312 (i.e., the sidewalls 312-2), other suitable structures capable of holding the substrates, and/or combinations thereof. In some embodiments, the semiconductor container 300 may further include a handle 302 (shown in FIG. 5) for attaching the semiconductor container 300 to the OHT vehicle 140. In some embodiments, the semiconductor container 300 may include another handle (not shown) disposed over an exterior surface of one of the sidewalls 312-2 for operator handling or human handling.

Figure 5:
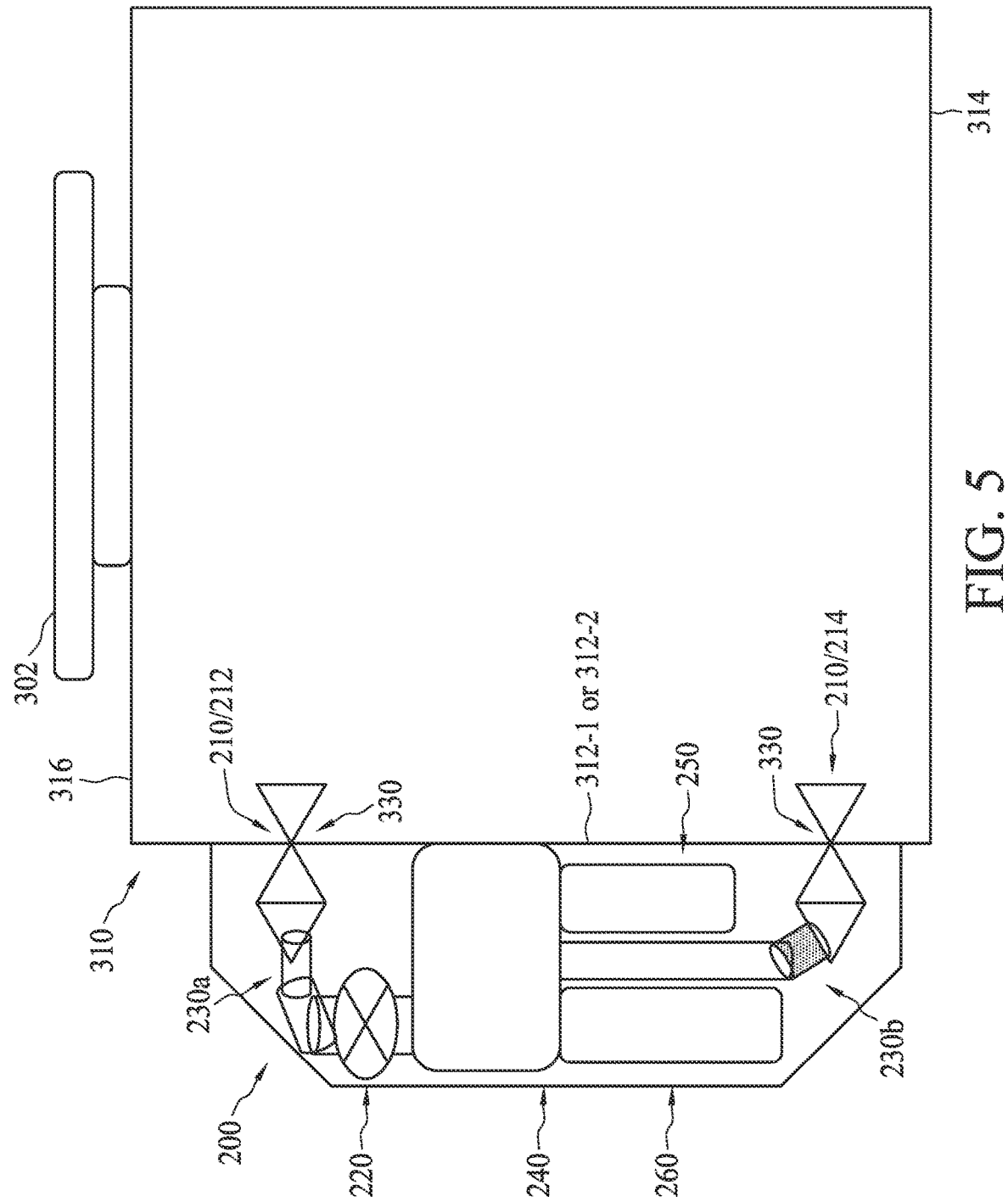
FIG. 5 is a schematic drawing illustrating a semiconductor container according to one or more embodiments.

In some embodiments, when the semiconductor container 300 is a FOUP, the air processing system 200 may be attached or installed on the backside wall 312-1 that is opposite to the front door, as shown in FIGS. 4 and 5, but the disclosure is not limited thereto. In such embodiments, at least two holes 330 penetrate the backside wall 312-1 opposite to the front door such that the air processing system 200 can be connected to the interior space through the two holes 330. In some embodiments, the inlet valve 212 is coupled to an upper hole 330 while the outlet valve 214 is coupled to a lower hole 330, as shown in FIG. 5, but the disclosure is not limited thereto. It should be noted that the coupling of the inlet and outlet valves 212 and 214 and the upper/lower holes 330 can be adjusted depending on different air flow requirements. Further, the holes 330 can be formed not only in the backside wall 312-1 opposite to the front door, but also on sidewalls 312-2, the bottom 314, or the top 316, depending on the container type. In other embodiments, the arrangement and the numbers of the holes 330 can be adjusted, depending on the container type or system 200 arrangement. In some embodiments, other elements in addition to the air processing system 200 can be attached or installed on the container body 310. In some embodiments, the air processing system 200 may include more than one exchange module 210. Accordingly, the number of the holes 330 for connecting the air processing system 200 to the interior space of the container body 310 can be modified.

In some embodiments, the air processing system 200 may be attached or installed on one of the sidewalls 312-2, as shown in FIG. 5. In such embodiments, the at least two holes 330 may penetrate the sidewall 312-2 such that the air processing system 200 can be connected to the interior space through the two holes 330. As mentioned above, the arrangement and the numbers of the holes 330 can be adjusted, depending on the container type or system 200 arrangement. In some embodiments, other elements in addition to the air processing system 200 can be attached or installed on the container body 310. In some embodiments, the air processing system 200 may include more than one exchange module 210. Accordingly, the number of the holes 330 for connecting the air processing system 200 to the interior space of the container body 310 can be modified. In some embodiments, the air processing system 200 disposed over the sidewall 312-2 may be used to replace the handle for human handling. In such embodiments, a dimension of the air processing system may be less than a dimension of the sidewall 312-2, but the disclosure is not limited thereto.

The air processing system 200 can include modules as mentioned above; therefore, repeated descriptions of details are omitted for brevity.

In some embodiments, the controller module 250 may send wired signal or wireless signal to the air extraction module 220. Accordingly, internal air may be extracted from the interior space 320 of the container body 310. In some embodiments, the inlet valve 212 may be automatically opened due to force generated by the air flow. In other embodiments, the opening of the inlet valve 212 can be controlled by the controller module 250. The air may pass through the air extraction module 220 and pushed into the processing module 240.

In some embodiments, the air extracted from the interior space 320 may bring residue generated from the current or previous processing step into the air processing system 200. In such embodiments, such residue may be filtered by a filter of the contaminant removal module 230 or the first contaminant removal module 230a before entering the air extraction module 220. As a result, contamination in the air processing system 200 can be reduced and the module service life of the air processing system 200 can be improved.

The air passing through the air extraction module 220 may be pushed into the processing module 240. In some comparative approaches, it is found that humidity of the air may be gradually increased to greater than approximately 4% after the current or previous processing step. The air with such humidity may accelerate oxidation, which occurs on and negatively affects conductive materials. According to the present disclosure, the air can be dried when passing through the processing module 240. In some embodiments, the desiccant materials in the processing module 240 may adsorb moisture from the air. Accordingly, the humidity is reduced. In some embodiments, the humidity can be reduced to below approximately 0.7%, but the disclosure is not limited thereto. In some embodiments, the humidity reduction may be controlled by the air flow speed, which is controlled by the efficiency of the air extraction module 220.

As mentioned above, the processing module 240 may further include filters for filtering residues or particles. Because the air may passes through at least the two filters (i.e., one in the air extraction module 220 and one in the processing module 240), particle or residue contamination can be further mitigated.

In some embodiments, the second contaminant removal module 230b helps further filter out particles and residue. As mentioned above, because the air passes through at least the three filters (i.e., one in the first air extraction module 220a, one in the processing module 240, and one in the second contaminant removal module 230b), particle or residues removal can be further improved. Thus container pollution or container contamination can be further mitigated.

The processed air may be pushed back into the interior space 320 through the outlet valve 214. In some embodiments, the outlet valve 214 may be automatically opened by the force generated by air flow. In some embodiments, the outlet valve 214 may be opened by the controller module 250.

In some embodiments, the air processing system 200 further helps to form a vacuum or a vacuum-like environment for the interior space 320. In such embodiments, the inlet valve 212 and the air extraction module 220 may be turned on, while the outlet valve 214 is closed. Therefore, air may be extracted from the interior space 320, and the vacuum or the vacuum-like environment is formed in the interior space 320. In other words, the air pressure of the interior space 320 can be adjusted to any desired level by the air extraction module 220.

In some embodiments, when the vacuum or the vacuum-like environment is not needed, the outlet valve 214 may be opened, and the air may pass through the processing module and the second contaminant removal module 230b, and back into the interior space 320. Further, because the air is dried and filtered when passing through the processing module and the second contaminant removal module 230b, the interior space 320 may obtain reduced-humidity and relatively clean air.

In some embodiments, as mentioned above, the controller module 250 further includes a heating/cooling chip attached or installed on the inlet valve 212 and/or the outlet valve 214. By turning the heating/cooling chip on and off, the temperature of the air being sent back to the interior space 320 can be controlled.

Figure 6:
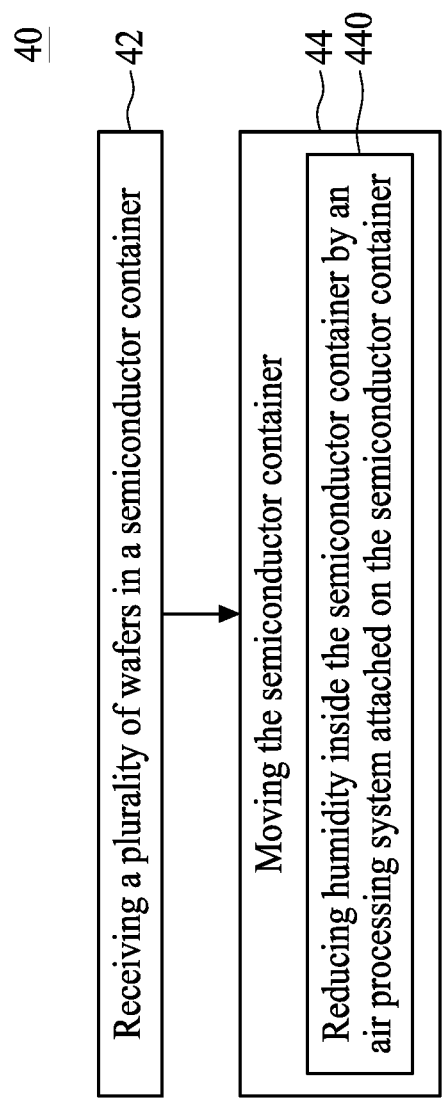
FIG. 6 is a flowchart of a method for transporting wafers according to various aspects of the present disclosure.

FIG. 6 is a flowchart of a method for transporting wafers 40 according to various aspects of the present disclosure. In some embodiments, the method 40 includes a number of operations (42, 44, and 440) and is further described below according to one or more embodiments. It should be noted that the operations of the method 40 may be omitted, rearranged, or otherwise modified within the scope of the various aspects. It should further be noted that additional operations may be provided before, during, and after the method 40, and that some other operations may be only briefly described herein.

In some embodiments, in operation 42, the method 40 includes receiving a plurality of wafers in a semiconductor container. In some embodiments, the semiconductor container may be the abovementioned semiconductor container 300 with the air processing system 200. In some embodiments, the semiconductor container 300 receives the wafers from a wafer storage via a stocker. In other embodiments, the semiconductor container 300 receives the wafers from a processing tool.

In some embodiments, in operation 44, the method 40 include moving the semiconductor container 300. In some embodiments, the semiconductor container 300 can be moved by an OHT vehicle 140 along a track 110 shown in FIG. 1. The OHT vehicle 140 may transport the semiconductor container 300 from a processing tool 120 to another processing tool 120 within a same bay (intra-bay transport) or in another bays (inter-bay transport).

In operation 440, which is performed simultaneously with operation 44, the method includes reducing humidity inside the semiconductor container 300 by the air processing system 200. In some embodiments, the method 40 include turning on the air extraction module 220 to extract air from inside the semiconductor container 300 into the air processing system 200 through the inlet valve 212. The method 40 reduces the humidity of the air when the air passes through the processing module 240. Functions of other modules in the air processing system 200 may be similar to those mentioned above; therefore, repeated descriptions of such details are omitted for brevity.

According to the method 40, the semiconductor container 300 can be referred to as a self-drying container. Because the air processing system 200 is installed on the container body 310 of the semiconductor container 300, an air processing function is performed together with the moving or transporting of the semiconductor container 300. Accordingly, the humidity of the air inside the semiconductor container 300 can be kept below a desired percentage by the air processing system 200 during the transporting of the wafers. Further, residues or particles from a current or previous processing tool can be filtered out by the air processing system 200. In some embodiments, the temperature of the air inside the semiconductor container 300 can be kept at a desired value by the air processing system 200 during the transporting of the wafers. In embodiments, the air processing system 200 helps to provide a vacuum or a vacuum-like environment in the semiconductor container 300 during the transporting of the wafers.

Additionally, the controller module 250 may turn the air extraction module 220 and the exchange module 210 on and off according to a time constraint or an event constraint as mentioned above. Therefore, the air processing system 200 is more practicable in the foundry.

Figure 7:
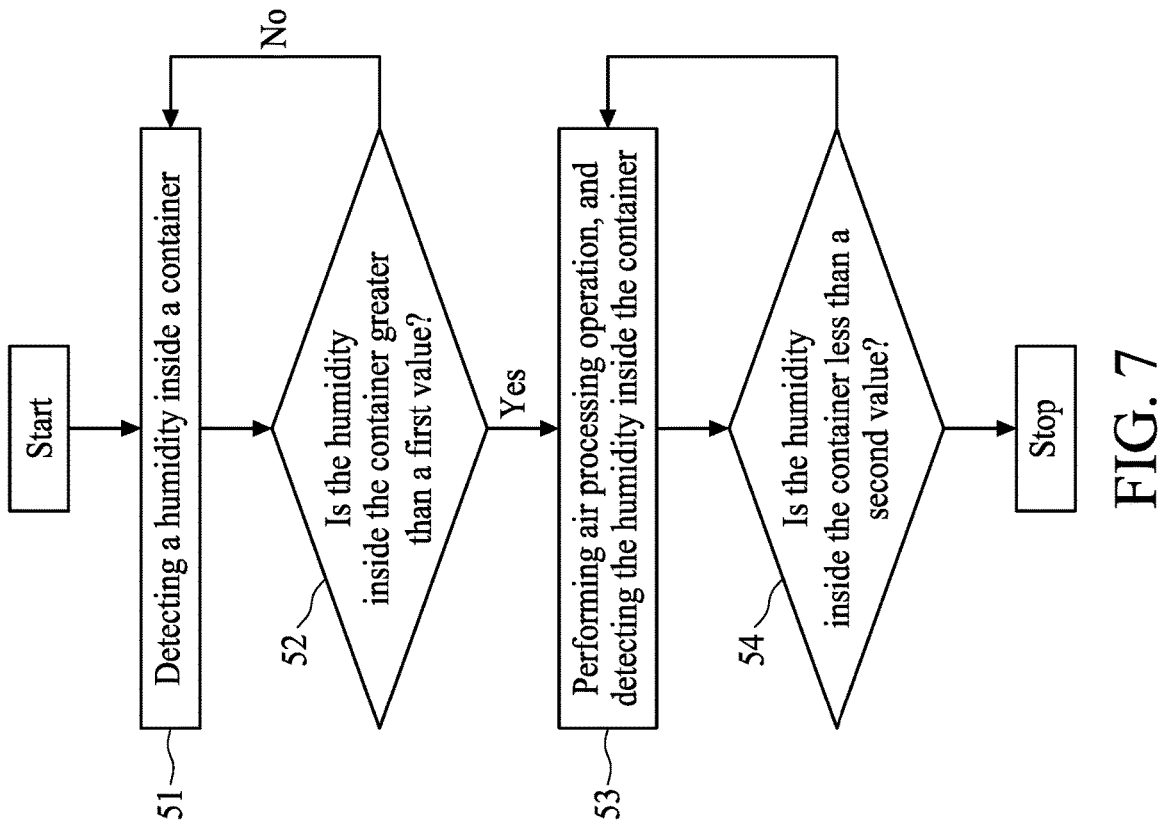
FIG. 7 is a flowchart of a method for air processing according to various aspects of the present disclosure.

FIG. 7 is a flowchart of a method for air processing 50 according to various aspects of the present disclosure. In some embodiments, the method 50 includes a number of operations (51, 52, 53, and 54) and is further described below according to one or more embodiments. It should be noted that the operations of the method 50 may be omitted, rearranged, or otherwise modified within the scope of the various aspects. It should further be noted that additional operations may be provided before, during, and after the method 50, and that some other operations may be only briefly described herein. In some embodiments, the method 50 may be integrated in the operation 440 of the method 40, but the disclosure is not limited thereto.

In some embodiments, the method 50 may be started simultaneously with operation 44 and/or 440. In some embodiments, the method 50 may be started by signals from external source.

In some embodiments, in operation 51, the method 50 may detect a humidity inside the container. As mentioned above, the container can be a semiconductor container, but the disclosure is not limited thereto. In some embodiments, the method 50 may trigger an air process operation according to the detected interior humidity. For example, in operation 52, when the humidity inside the container is not greater than a first value, the method may turn back to operation 51, thus to monitor the interior humidity inside the container. Further, in operation 52, when the humidity inside the container is greater than the first value, the method may move onto operation 53 to trigger the air processing operation. In some embodiments, the first value can be approximately 1.2%, but the disclosure is not limited thereto. In such embodiments, when the humidity inside the container is not greater than approximately 1.2%, the method 50 may turn back to operation 51, or, alternatively, move onto operation 53 when the humidity inside the container is greater than approximately 1.2%. It should be noted that the first value can be modified according to different environment requirements.

In operation 53, in some embodiments, the air processing operation can be performed by the air processing system 200 as mentioned above; therefore, repeated descriptions of such details are omitted for brevity. Further, in operation 53, the method keeps detecting the humidity inside the container.

In some embodiments, the method 50 may decide next operation according to the detected interior humidity. For example, in operation 52, when the humidity inside the container is not less than a second value, the method may turn back to operation 53, thus to keep on processing the interior air inside the container. Further, in operation 54, when the humidity inside the container is less than the second value, the method 50 may stop the operations. In some embodiments, the second value may be the same with the first value. It should be noted that the first value and the second value can be modified according to different environment requirements. In some alternative embodiments, the second value may be different from the first value. For example, the second value can be approximately 0.8%, but the disclosure is not limited thereto. In such embodiments, when the humidity inside the container is not less than approximately 0.8%, the method 50 may turn back to operation 53, or, alternatively, may stop the operations when the humidity inside the container is less than approximately 0.8%.

Additionally, the method 50 may stop all the operations by an alarm. In some embodiments, the alarm may be triggered when the battery power is low. In some embodiments, the alarm may be triggered when the replacement of the adsorbing material in the processing module is in need. In some embodiments, the alarm may be triggered according to external signal.

In summary, the present disclosure provides an air processing system that can be installed on a semiconductor container. The air processing system helps to develop a low humidity and a clean condition at a desired temperature inside the semiconductor container. Further, the air processing system can be moved together with the semiconductor container, allowing the air processing system to maintain such conditions inside the semiconductor container during the storage and transport. Accordingly, the wafers can be stored and transported in a desired environment, thus improving yield.

According to one embodiment of the present disclosure, an air processing system is provided. The air processing system includes an inlet valve and an outlet valve coupled to a semiconductor container, an air extraction module configured to extract air from the semiconductor container, a first contamination removal module coupled to the inlet valve and the air extraction module, and a processing module coupled to the air extraction module. The processing module includes at least an adsorbing element.

According to one embodiment of the present disclosure, a container is provided. The container includes a container body and an air processing system. The container body includes a plurality of walls defining an interior space for receiving wafers. The air processing system is attached to the container body. The air processing system includes an exchange module, an air extraction module, a first contaminant removal module, a processing module, a second contaminant removal module, a controller module, and a power module. The exchange module is coupled to one of the walls of the container body. The air extraction module is configured to extract air from the container body. The first contaminant removal module is coupled to the air extraction module and the exchange module. The processing module is coupled to the air extraction module. The second contaminant removal module is coupled to the processing module and the exchange module. The controller module is configured to turn the air extraction module on and off.

According to one embodiment of the present disclosure, a method for transporting wafers is provided. The method includes following operations. A plurality of wafers are received in a semiconductor container. The semiconductor container is moved. A humidity inside the semiconductor container is reduced. In some embodiments, the humidity is reduced to below approximately 0.7% during the moving of the semiconductor container. In some embodiments, the reducing of the humidity is performed by an air processing system attached to the semiconductor container. In some embodiments, the air processing system includes an exchange module, an air extraction module, a first contaminant removal module, a processing module, a second contaminant removal module and a controller module. The exchange module is coupled to the semiconductor container. The air extraction module is configured to extract air from the container body. The first contaminant removal module is coupled to the air extraction module and the exchange module. The processing module is coupled to the air extraction module. The second contaminant removal module is coupled to the processing module and the exchange module. The controller module is configured to turn the air extraction module on and turn off.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An air processing system comprising:
   an inlet valve and an outlet valve coupled to a semiconductor container attached to a mobile vehicle, wherein the air processing system is isolated from the semiconductor container when the inlet valve and the outlet valve are closed, and the air processing system is connected to the semiconductor container when the inlet valve and/or the outlet valve are opened;
   a pump configured for extracting air from the semiconductor container;
   a controller module configured to turn the pump on and off, wherein the controller module is disposed between the inlet valve and the outlet valve;
   a power module disposed between the inlet valve and the outlet valve;
   a first filter coupled to the inlet valve and the pump; and
   a desiccant coupled to the pump, wherein the desiccant comprises at least an adsorbing element.

2. The system of claim 1, further comprising a second filter coupled to the desiccant and the outlet valve.

3. The system of claim 2, wherein the second filter comprises a particle filter, an AMC filter, or activated carbon.

4. The system of claim 1, wherein the first filter comprises a particle filter, an AMC filter, or activated carbon.

5. The system of claim 1, wherein the desiccant comprises molecular sieve, silica gel, bentonite clay, calcium chloride ($CaCl_2$), magnesium chloride ($MgCl_2$), or activated aluminum oxide.

6. The system of claim 1, wherein the desiccant comprises a particle filter or a chemical filter.

7. The system of claim 1, wherein the power module is pluggable.

8. The system of claim 1, wherein the controller module further comprises at least a humidity sensor and/or a temperature sensor.

9. The system of claim 1, wherein the desiccant is pluggable, and the adsorbing element of the desiccant is replaceable according to different processing requirements.

10. The system of claim 1, further comprising at least a heating/cooling chip installed on the inlet valve or the outlet valve.

11. A container of a mobile vehicle, comprising:
    a container body of the mobile vehicle comprising a plurality of walls defining an interior space for receiving wafers; and
    an air processing system attached to the container body, wherein the air processing system comprises:

an inlet valve and an outlet valve coupled to one of the walls of the container body, wherein the air processing system is isolated from the interior space of the container body when the inlet valve and the outlet valve are closed, and the air processing system is connected to the interior space of the container body when the inlet valve and/or the outlet valve are opened;

a pump configured for extracting air from the interior space of the container body;

a first filter coupled to the inlet valve and the pump;

a desiccant coupled to the pump;

a second filter coupled to the desiccant and the outlet valve;

a controller module configured to turn the pump on and off, and between the inlet valve and the outlet valve; and a power module disposed between the inlet valve and the outlet valve.

12. The container of claim 11, wherein the inlet valve and the outlet valve are coupled to a same wall of the container body.

13. The container of claim 11, wherein the first filter of the air processing system comprises a particle filter, an AMC filter, or activated carbon.

14. The container of claim 11, wherein the second filter of the air processing system comprises a particle filter, an AMC filter or activated carbon.

15. The container of claim 11, wherein the controller module of the air processing system further comprises at least a humidity sensor and/or a temperature sensor.

16. The container of claim 11, wherein the air processing system further comprises at least a heating/cooling chip installed on the inlet valve or the outlet valve.

17. The container of claim 11, wherein the desiccant and the power module are pluggable.

18. A method for transporting wafers, comprising:
receiving a plurality of wafers in a semiconductor container of a mobile vehicle;
moving the semiconductor container and the mobile vehicle; and
reducing humidity inside the semiconductor container to below approximately 0.7% during the moving of the semiconductor container, wherein the reducing of the humidity is performed by an air processing system attached to the semiconductor container, and the air processing system comprises:
an inlet valve and an outlet valve coupled to the semiconductor container, wherein the air processing system is isolated from the semiconductor container when the inlet valve and the outlet valve are closed, and the air processing system is connected to the semiconductor container when the inlet valve and/or the outlet valve are opened;

a pump configured for extracting air from the semiconductor container;

a first filter coupled to the pump and the inlet valve;

a desiccant coupled to the first filter;

a second filter coupled to the desiccant and the outlet valve;

a controller module configured to turn the pump on and off, wherein the controller module is disposed between the inlet valve and the outlet valve; and a power module disposed between the inlet valve and the outlet valve.

19. The method of claim 18, where the reducing of the humidity inside the semiconductor container comprises:
turning on the pump to extract air from inside the semiconductor container into the air processing system through the inlet valve;
reducing the humidity of the air when the air passes through the desiccant; and
returning the air back to the semiconductor container through the outlet valve.

20. The method of claim 19, further comprising removing particles or airborne molecular contamination (AMC) when the air passes through the first filter and/or the second filter.

* * * * *